United States Patent [19]

Ohya et al.

[11] 4,322,758
[45] Mar. 30, 1982

[54] FLUORESCENT INDICATOR

[75] Inventors: Hiroshi Ohya, Hachiohji; Kozo Kobayashi, Kodaira, both of Japan

[73] Assignee: Nakamichi Corporation, Tokyo, Japan

[21] Appl. No.: 145,864

[22] Filed: May 1, 1980

[30] Foreign Application Priority Data

| May 7, 1979 | [JP] | Japan | 54-55416 |
| May 15, 1979 | [JP] | Japan | 54-64747[U] |
| May 21, 1979 | [JP] | Japan | 54-68115[U] |
| May 25, 1979 | [JP] | Japan | 54-70335[U] |
| May 30, 1979 | [JP] | Japan | 54-72661[U] |

[51] Int. Cl.³ .................. G11B 27/36; H05B 37/00
[52] U.S. Cl. ............................... 360/31; 340/753
[58] Field of Search .................. 360/25, 26, 31, 27; 340/753, 754, 772, 781

[56] References Cited

U.S. PATENT DOCUMENTS

| 3,967,158 | 6/1976 | Saxon | 340/753 |
| 4,062,047 | 12/1977 | Scull | 360/26 |
| 4,187,505 | 2/1980 | Morley et al. | 340/753 |
| 4,224,616 | 9/1980 | Kamagata et al. | 340/754 |

Primary Examiner—Vincent P. Canney
Attorney, Agent, or Firm—Pearne, Gordon, Sessions, McCoy & Granger

[57] ABSTRACT

This invention pertains to a fluorescent indicator adapted to indicate a level of a signal to be measured in an acoustic instrument and/or a vertical condition of a magnetic head in a multi-channel tape recorder.

The fluorescent indicator comprises a fluorescent indicating tube having a plurality of segment anodes arranged in a row from a lowest level side to a highest level side, pulse generator means to generate clock pulses having the number of pulses corresponding to the level of a signal, and counter means including a plurality of output terminals connected to the respective segment anodes to have output signal sequentially generated corresponding to the count of the clock pulses to operate the segment anodes of the fluorescent indicating tube. The fluorescent indicating tube starts to be operated on starting to count the clock pulses and the segment anodes of the fluorescent indicating tube are sequentially operated from the lowest level side toward the highest level side as the signal level becomes higher. The fluorescent indicator may be applied to a tape recorder having a multi-channel magnetic head and may further comprise a phase difference detector to electrically detect a phase difference between playback outputs of the two different channels on the magnetic head, and the output of the phase difference detector being adapted to operate one of the segment anodes of the fluorescent indicating tube corresponding to the phase difference of the playback outputs.

9 Claims, 9 Drawing Figures

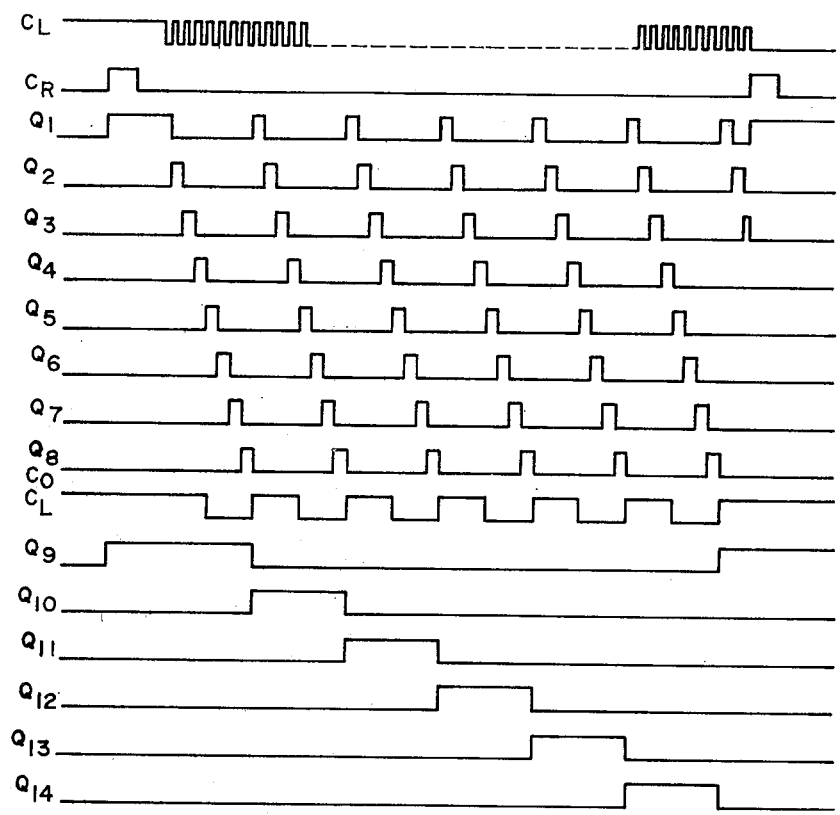
FIG. 4
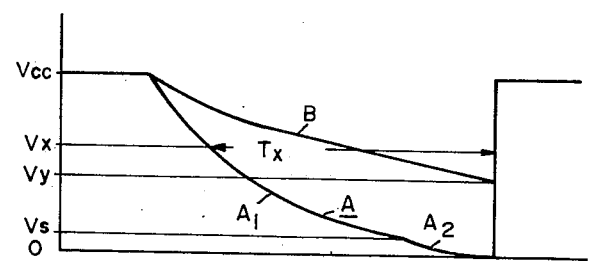
FIG. 6 (b)
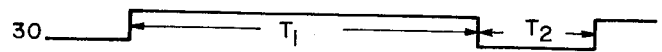

FLUORESCENT INDICATOR

BACKGROUND OF THE INVENTION

In the prior art, a fluorescent indicator to indicate a signal level to be measured in an acoustic instrument comprises a fluorescent indicating tube including a plurality of segment anodes arranged in parallel to each other in a row, a grid having a drive voltage applied thereto, and a filament having a voltage applied thereto, and a plurality of comparators having the number corresponding to that of the segment anodes and connected thereto, respectively. The comparators each have one input terminal to which a peak level or a detected output of an audio signal to be measured is applied, and have another input terminal to which reference voltages are applied. The reference voltages to the comparators are so different from each other that the reference voltages of the comparators sequentially or steppedly increase in their levels. Thus, the segments of the fluorescent indicating tube are ignited from the lowest level side toward the highest level side in accordance with the levels of the detected output to be measured. As the number of the segment anodes of the fluorescent indicating tube increases, the signal level can be indicated over a wide range of level and with more precision. With the prior fluorescent indicator, however, since there is required the number of the comparators or the driving circuits corresponding to that of the segment anodes of the fluorescent indicating tube, the size of the indicator tends to be larger while the cost of the indicator tends to be higher. This tendency is prominent in an acoustic instrument because the signal levels of left and right channels are to be normally indicated. Furthermore, the prior fluorescent indicator disadvantageously cannot indicate VU and peak levels in a simultaneous manner. The construction of the indicator will be more complicated in order to accomplish this.

In a tape recorder, if a magnetic head is not positioned in a proper vertical condition, the loss of a high frequency range is large and therefore an excellent characteristic of the tape recorder cannot be obtained. In order to accomplish a proper vertical condition of a magnetic head, in a prior tape recorder provided with a single reproducing head or a single recording/reproducing head, a test signal on a test tape for adjusting the vertical condition is reproduced by the reproducing or recording/reproducing head and read out by a vacuum tube volt meter (referred to as a VTVM hereinafter) while the magnetic head is adjusted in its vertical position so that the VTVM indicates the maximum output level, and in a prior tape recorder provided with both a recording head and a reproducing head separated from each other, a high frequency test signal on a magnetic tape recorded by the recording head is reproduced by the reproducing head and read out by a VTVM while the recording head is adjusted in its vertical position so that the VTVM indicates the maximum output level. However, various measuring devices such as a VTVM are required to adjust the magnetic head in its vertical position, and a high skill is also required to adjust the magnetic head so that the maximum output level is obtained at the VTVM.

SUMMARY OF THE INVENTION

Accordingly, it is a principal object of the invention to provide a fluorescent indicator which can be constructed in a simple manner.

It is another object of the invention to provide a fluorescent indicator which can be inexpensively produced.

It is further object of the invention to provide a fluorescent indicator to indicate a peak level of an audio signal to be measured in an acoustic instrument over a wide range and with more precision.

It is further object of the invention to provide a fluorescent indicator adapted to simultaneously indicate a VU level and a peak level of an audio signal to be measured in an acoustic instrument.

It is a further object of the invention to provide a fluorescent indicator adapted to indicate a level of an audio signal to be measured and also a vertical condition of a magnetic head in a multi-channel tape recorder.

In accordance with one aspect of the invention, there is provided a fluorescent indicator comprising at least one fluorescent indicating tube having a plurality of segment anodes arranged in a row from a lowest level side to a highest level side, pulse generator means to generate clock pulses having the number of pulses corresponding to that of the signal levels to be measured, and counter means including a plurality of output terminals connected to said segments anodes, respectively, to have output signals sequentially generated corresponding to the count of said clock pulses to operate said segment anodes of said fluorescent indicating tube, said fluorescent indicating tube starting to be operated on initiation of counting the clock pulses and said segment anodes of said fluorescent indicating tube being sequentially operated from the lowest level side toward the highest level side as the signal level becomes higher.

In accordance with another aspect of the invention, there is provided a fluorescent indicator used for a tape recorder having a multi-channel magnetic head comprising at least one fluorescent indicating tube having a plurality of segment anodes arranged in a row from a lowest level side to a highest level side, pulse generator means to generate clock pulses having the number of pulses corresponding to the level of a signal to be measured, counter means including a plurality of output terminals connected to said segment anodes of said fluorescent indicating tube, respectively, to have output signals sequentially generated corresponding to the count of said clock pulses to operate said segment anodes of said fluorescent indicating tube, said fluorescent indicating tube starting to be operated on initiation of counting said clock pulses while said segment anodes of said fluorescent indicating tube are sequentially operated from the lowest level side toward the highest level side as the signal level becomes higher, and a phase difference detector to electrically detect a phase difference signal between reproducing output signals for the channels on a magnetic tape of said tape recorder, said phase difference detector being associated with said pulse generator means so that said segment anodes are alternately ignited at one period by a reference signal having the level equal to that of said phase difference signal which is detected when there is no phase difference between said reproducing output signals and at another period by said phase difference signal having the level lower than that of said reference signal in accordance with a phase difference between said reproducing output signals.

BRIEF DESCRIPTION OF THE DRAWINGS

The above and other objects and features of the invention will be understood by those skilled in the art from the embodiment of the invention taken with reference to the accompanying drawings in which;

FIG. 4 shows a time chart of counter means used in the fluorescent indicator of FIG. 3;

FIGS. 6a and 6b show a function generator and waveforms of the portions of the function generator;

DETAILED DESCRIPTION OF THE EMBODIMENT

Figure 1:
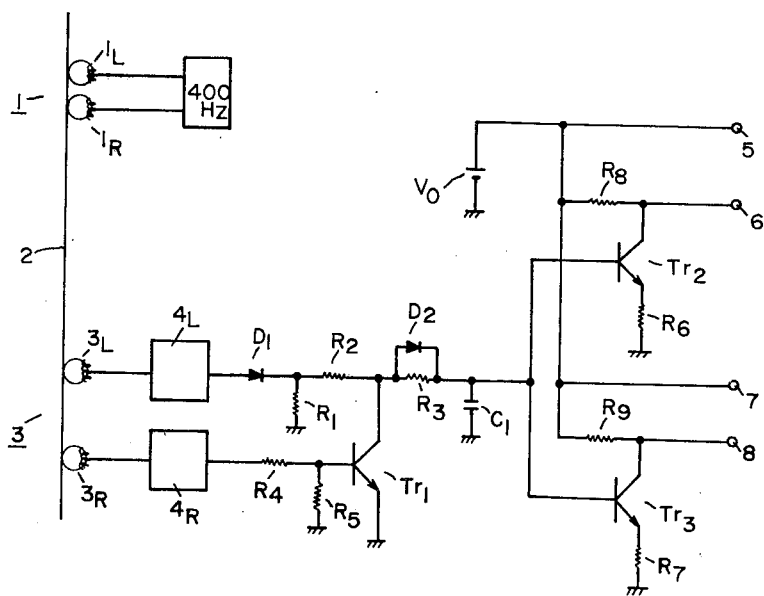
FIG. 1 is a schematic diagram of a phase difference detector for a multi-channel tape recorder.
Figures 3, 6:
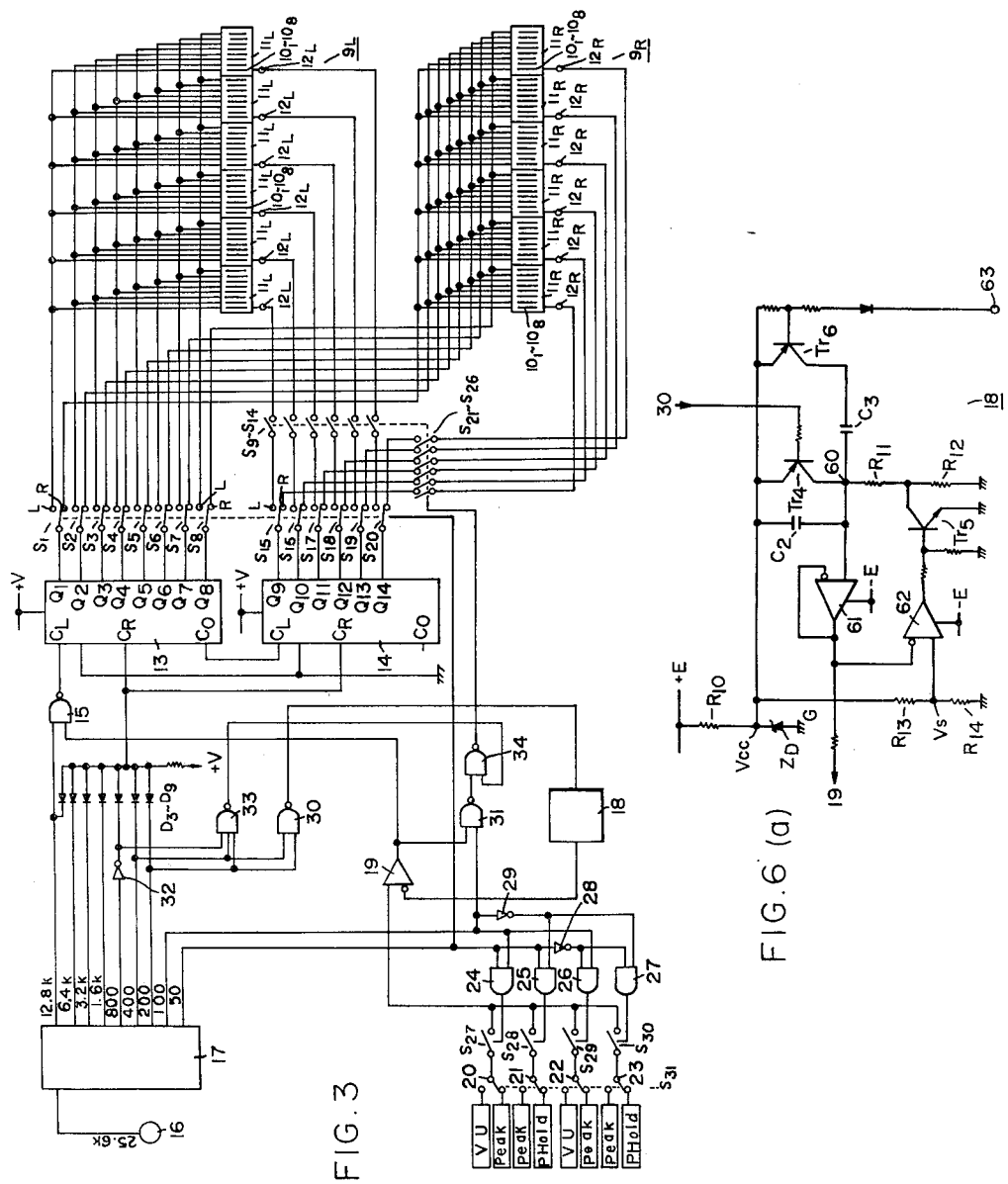
FIG. 3 is a schematic diagram of a fluorescent indicator constructed in accordance with the invention.

A fluorescent indicator of the invention, in the illustrated embodiment, comprises a phase difference detector as shown in FIG. 1 and drive means of a fluorescent indicator as shown in FIG. 3.

FIG. 1 shows a phase difference detector for a three-head tape recorder having a magnetic recording head and a magnetic reproducing head separately provided therein. A magnetic tape 2 has two test signals of sine-wave having a frequency of 400 Hz recorded by a recording head 1 at the same phase and at two different channels such as a left channel and a right channel. The test signals on the magnetic tape are simultaneously reproduced by a reducing head 3. Magnetic head elements 1L, 1R, 3L and 3R correspond to L and R channels of the magnetic heads 1 and 3, respectively. The reproduced output signals at the L and R channels are introduced into waveform modifiers 4L and 4R, respectively. An output of the waveform modifier 4L for the L channel is connected through a forwarded diode D, resistors $R_1$ and $R_2$ to one of junction points of a diode $D_2$ and a resistor $R_3$ connected in parallel to each other, while an output of the waveform modifier 4R for the R channel is connected through resistors $R_4$ and $R_5$ to a base of an NPN transistor $Tr_1$ which has a collector connected to the one junction point of the diode $D_2$ and the resistor $R_3$ and an emitter grounded to earth. The other junction point of the diode $D_2$ and the resistor $R_3$ is grounded to earth through a capacitor $C_1$ having a large capacitance, and also connected to bases of NPN transistors $Tr_2$ and $Tr_3$. The transistors $Tr_2$ and $Tr_3$ have respective emitters grounded to earth through respective resistors $R_6$ and $R_7$, and respective collectors connected through respective resistors $R_8$ and $R_9$ to a DC voltage source $V_0$. Output terminals 5 and 7 are connected to respective junction points of the DC voltage source $V_0$ and the respective resistors $R_8$ and $R_9$ while output terminals 6 and 8 are connected to the respective collectors of the transistors $Tr_2$ and $Tr_3$.

Figure 2:
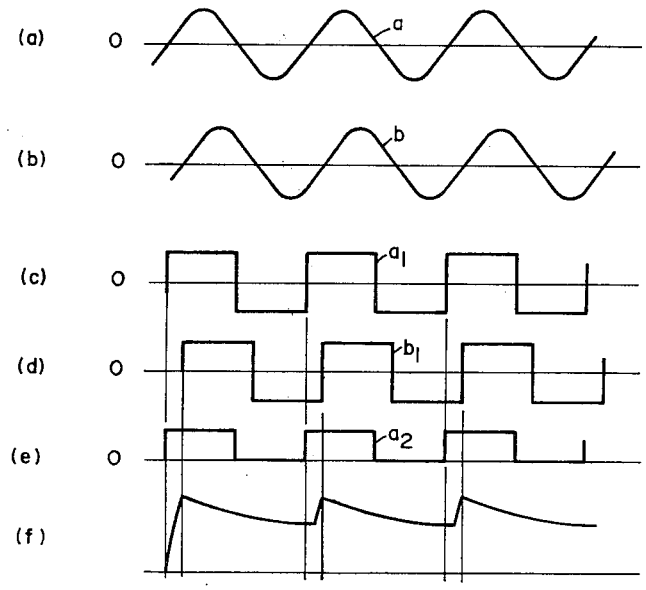
FIG. 2 shows waveforms in various parts of the detector of FIG. 1.

In the phase difference detector of FIG. 1, if the recording head 1 and the reproducing head 3 are not aligned in their vertical conditions, there is a phase difference between the reproduced outputs a and b from the reproducing head elements 3L and 3R as shown in FIGS. 2a and 2b. The reproduced outputs a and b are modified by the respective waveform modifiers 4L and 4R into square wave signals $a_1$ and $b_1$ as shown in FIGS. 2c and 2d, respectively. The square wave signal $a_1$ for the L channel is modified by the diode $D_1$ into a signal $a_2$ of waveform as shown in FIG. 2e. While the transistor $Tr_1$ which is controlled by the square wave signal $b_1$ for the R channel is turned off, the capacitor $C_1$ is charged by the signal $a_2$ for the L channel. While the transistor $Tr_1$ is turned on, the capacitor $C_1$ is discharged through the resistor $R_3$ and the collector and emitter of the transistor $Tr_1$. Since the resistance value of the resistor $R_3$ is so set to be substantially higher than that of the resistor $R_2$, the capacitor $C_1$ is quickly charged through the diode $D_2$ while it is slowly discharged through the resistor $R_3$ as shown in FIG. 2f to control the transistors $Tr_2$ and $Tr_3$. The charged voltage across the capacitor $C_1$ is proportional to the phase difference between the reproduced outputs a and b. Since the transistors $Tr_2$ and $Tr_3$ have circuit constants set not to be saturated, the conductivity of the transistors $Tr_2$ and $Tr_3$ between their collectors and emitters varies on the voltage across the capacitor $C_1$ which is applied to the bases of the transistors $Tr_2$ and $Tr_3$. Thus, it will be noted that the DC voltage $V_0$ is normally established across the output terminals 5 and 7, but that if there is no phase difference between the reproduced outputs a and b, the DC voltage $V_0$ is established across the output terminals 6 and 8 while if there is a phase difference between the reproduced outputs a and b, a phase difference voltage reversely proportional to the degree of the phase difference is established across the output terminals 6 and 8.

FIG. 3 shows a fluorescent indicator to indicate signal levels for the L and R channels and also a vertical condition of the magnetic head.

Two fluorescent indicating panels 9L and 9R for the left and right channels each comprise six identical fluorescent indicating tubes 11L and 11R disposed in parallel to each other and each having eight segment anodes $10_1$ to $10_8$ arranged in a row. The respective fluorescent indicating tubes 11L and 11R each have respective grid terminals 12L and 12R and also have respective filaments (not shown) to which a voltage is applied.

The segment anodes $10_1$ of the respective fluorescent indicating tubes 11L and 11R for indicating the minimum signal level are connected in parallel to each other through a L/R change-over switch $S_1$ such as an analogue switch between an output terminal $Q_1$ of a first counter 13 and the grounded earth (not shown) on the side of the tubes 11L and 11R. Similarly, the segment anodes $10_2$ to $10_8$ of the respective fluorescent indicating tubes 11L and 11R are connected in parallel to each other through respective L/R change-over switches $S_2$ to $S_8$ such as analogue switches between respective output terminals $Q_2$ to $Q_8$ of the first counter 13 and the grounded earth on the sides of the fluorescent indicating tubes 11L and 11R.

The grid terminals 12L of the respective fluorescent indicating tubes 11L for the L channel are connected through respective switches $S_9$ to $S_{14}$ and L/R change-over switches $S_{15}$ to $S_{20}$ which may comprise an analogue switch to respective output terminals $Q_9$ to $Q_{14}$ of a second counter 14 while the grid terminals 12R of the respective fluorescent indicating tubes 11R for the channel are connected through respective switches $S_{21}$ to $S_{26}$ such as analogue switches and the aforementioned L/R change-over switches $S_{15}$ to $S_{20}$ to the respective output terminals $Q_9$ to $Q_{14}$ of the second counter 14. The first and second counters 13 and 14 constitute counter means and may be composed of identical counters. Since, in the illustrated embodiment, the respective fluorescent indicating tubes comprise eight segment anodes, the counters are of octadic scale and may be suitably of Octal Counter (Article No. TC 4022p) commercially available from Tokyo Shibaura Electric Co., Ltd., Tokyo, Japan. Although the TC 4022p counter is of integral circuit having sixteen terminals, FIG. 3 shows only the terminals of the counters necessary for the operation of the indicator of the invention. The output terminals $Q_9$ to $Q_{14}$ of the second counter 14 correspond to the output terminals $Q_1$ to $Q_6$ of the first counter 13, the output terminals of the second counter 14 corresponding to the output terminals $Q_7$ and $Q_8$ of the first counter 13 being omitted because they are not necessary.

The first and second counters 13 and 14 have respective clock terminals $C_L$, reset terminals $C_R$ and carrying out terminals $C_o$. The carrying out terminals $C_O$ of the first counter 13 is connected to the clock terminals $C_L$ of the second counter 14, while the carrying out terminal $C_o$ of the second counter 14 is open.

The operation of the first and second counters 13 and 14 will be described with reference to FIG. 4. The level conditions of "High" and "Low" of the signal level will be referred to "Hi" and "Lo" hereinafter. The output terminal $Q_1$ ($Q_9$) responds to a reset pulse applied to the reset terminal $C_R$ so that it becomes "Hi" from "Lo" at the raising up of the reset pulse while it becomes "Lo" from "Hi" at the first raising up of the series of the clock pulses, and it is "Hi" during the time at which the 8N-th and (8N+1)th clock pulses (N is a positive integral number) such as the eighth and ninth clock pulses or the sixteenth and seventeenth clock pulses are raised up. The output terminal $Q_2$ ($Q_{10}$) is normally "Lo", but it is "Hi" during the time at which the (8N+1)th and (8N+2)th clock pulses such as the first and second clock pulses or the ninth and tenth clock pulses are raised up, when the series of clock pulses are applied to the clock terminal $C_L$. Similarly, the output terminals $Q_3$ ($Q_{11}$), $Q_4$ ($Q_{12}$), $Q_5$ ($Q_{13}$), $Q_6$ ($Q_{14}$), $Q_7$ and $Q_8$ are normally "Lo", but when the series of clock pulses are applied to the clock terminal $C_L$, they are "Hi" at a spaced period. It is while the (8N+2)th and (8N+3)th clock pulses such as the second and third clock pulses or the tenth and eleventh clock pulses are raised up that the output terminal $Q_3(Q_{11})$ is "Hi", while the (8N+3)th and (8N+4)th clock pulses such as the third and fourth clock pulses or the eleventh and twelfth clock pulses are raised up that the output terminal $Q_4(Q_{12})$ is "Hi", while the (8N+4)th and (8N+5)th clock pulses such as the fourth and fifth clock pulses or the twelfth and thirteenth clock pulses are raised up that the output terminal $Q_5(Q_{13})$ is "Hi", while the (8N+5)th and (8N+6)th clock pulses such as the fifth and sixth clock pulses or the thirteenth and fourteenth clock pulses are raised up that the output terminal $Q_6(Q_{14})$ is "Hi", while the (8N+6)th and (8N+7)th clock pulses such as the sixth and seventh clock pulses or the fourteenth and fifteenth clock pulses are raised up that the output terminal $Q_7$ is "Hi", and while the (8N+7)th and (8N+8)th clock pulses such as the seventh and eighth block pulses or the fifteenth and sixteenth clock pulses are raised up that the output terminal $Q_8$ is "Hi". The carrying out terminal $C_O$ is normally "Hi", but when the series of clock pulses are applied to the clock terminal $C_L$, the carrying out terminal $C_O$ becomes "Lo" from "Hi" at the raising up of the fourth clock pulse, "Hi" from "Lo" at the raising up of the eighth clock pulse, "Lo" from "Hi" at the raising up of the twelveth clock pulse, similarly is "Hi" while the sixteenth and twentieth clock pulses or the twenty-fourth and twenty-eighth clock pulses are raised up.

Since the output at the carrying out terminal $C_O$ of the first counter 13 is applied to the clock terminal $C_L$ of the second counter 14 as clock pulses, the output terminal $Q_9$ of the second counter 14 is "Hi" during the first time at which the output terminals $Q_1$ to $Q_8$ of the first counter 13 are sequentially "Hi" when the series of clock pulses are applied to the clock terminal $C_L$ of the first counter 13. The output terminals $Q_{10}$, $Q_{11}$ - - - of the second counter 14 are sequentially "Hi" during the sequential times such as the second, third - - - times at which the output terminals of the first counter 13 are sequentially "Hi". Thus, the first and second counters 13 and 14 count the number of the clock pulses applied to the clock terminal $C_L$ of the first counter 13, and the output terminals $Q_1$ to $Q_8$ and $Q_9$ to $Q_{14}$ generate the output signals of "Hi" in accordance with the count of the clock pulses.

The first and second counters 13 and 14 are cleared up when a reset pulse of "Hi" is applied from counter reset means described later to the reset terminals $C_R$, and the output terminals $Q_1$ and $Q_9$ and the carrying out terminal $C_O$ become "Hi" while the other output terminals become "Lo".

It will be noted that, with the arrangement of the fluorescent indicating tubes 11L and 11R and the first and second counters 13 and 14, when a series of forty-eight clock pulses are applied to the clock terminal $C_L$ of the first counter 13, the forty-eight different output signals are generated from the output terminals $Q_1$ to $Q_{14}$. The output signals cause the forty-eight segments of the fluorescent indicating panels 9L and 9R for the L and R channels to be sequentially operated from the lowest level side toward the highest level side.

The clock terminal $C_L$ of the first counter 13 is connected to a NAND gate 15. To one of the input terminals of the NAND gate 15 is a pulse signal of 12.8 kHz which is generated by a frequency divider 17 to divide at $\frac{1}{2}^m$ (m=1, 2, 3, - - - 9) a pulse signal of 25.6 kHz from an oscillator 16 while to the other input terminal of the NAND gate 15 is applied an output of a comparator 19 which compares a detected output of an audio signal to be measured with an output from a function generator 18 to generate an output of "Hi" while the level of the detected output is higher than that of the output from the function generator and to generate an output of "Lo" while the level of the detected output is lower than that of the output from the function generator 18. Thus, the NAND gate 15 generates the output of "Hi" while the output of the comparator 19 is "Lo", and applied to the clock terminal $C_L$ of the first counter 13 clock pulses which are obtained by dividing pulses of 25.6 kHz by the frequency divider 17 and then reversing them while the output of the comparator 19 is "Hi". Pulse generator means comprises the oscillator 16, the frequency divider 17 and the comparator 19. Nine pulse signals which have the frequencies different from each other and which are obtained by the frequency divider 17 have the phase relation as shown in FIGS. 5a and 5b. FIGS. 5a and 5b show a time chart divided into two portions with the joint shown to be a line x. A detected output for the L channel is applied to input terminals 20 and 21 while a detected output for the R channel is applied to input terminals 22 and 23. The input terminals 20 to 23 are connected through switches $S_{27}$ to $S_{30}$ such as analogue switches to the one input terminal of the comparator 19. By operating a manually operated switch $S_{31}$, peak detected outputs (or VU detected outputs) for the L and R channels are applied to the input terminals 20 and 22, respectively, while peak hold detected outputs (or peak detected outputs) for the L and R channels are applied to input terminals 21 and 23, respectively. A detecting circuit which generates the detected outputs may be conventional and will not be described in details. The peak hold detected outputs are ones which are held at the peak level of the peak detected outputs for a few seconds. The switches $S_{27}$ to $S_{30}$ are controlled by outputs of AND gates 24 to 27, respectively, so that when the outputs of the AND gates 24 to 27 are "Hi", the switches $S_{27}$ to $S_{30}$ are closed to sample the detected outputs which are applied to the comparator 19. A pulse signal of 50 Hz from the frequency divider is applied to one of inputs of the AND gates 24 and 25, a pulse signal which is obtained by reversing the pulse signal of 50 Hz by an inverter 28 to one of inputs of the AND gates 26 and 27, a pulse signal of 100 Hz from the frequency divider 17 to the other inputs of the AND gates 24 and 26, and a pulse signal which is obtained by reversing the pulse signal of 100 Hz by an inverter 29 to the other inputs of the AND gates 25 and 27. As shown in FIGS. 5a and 5b, the switches $S_{27}$ to $S_{30}$ are changed so that the switches $S_{30}$, $S_{29}$, $S_{28}$, $S_{27}$, $S_{30}$, $S_{29}$ - - - are sequentially closed at a period of $T_0$ (=5 msec.). The pulse signal of 50 Hz causes the L/R change-over switches $S_1$ to $S_8$ and $S_{15}$ to $S_{20}$ to be changed to the L terminals when it is "Hi" and to be changed to the R terminals when it is "Lo" so that the counters 13 and 14 are alternately connected to the fluorescent indicating panels 9L and 9R every 10 msec.

Figure 5:
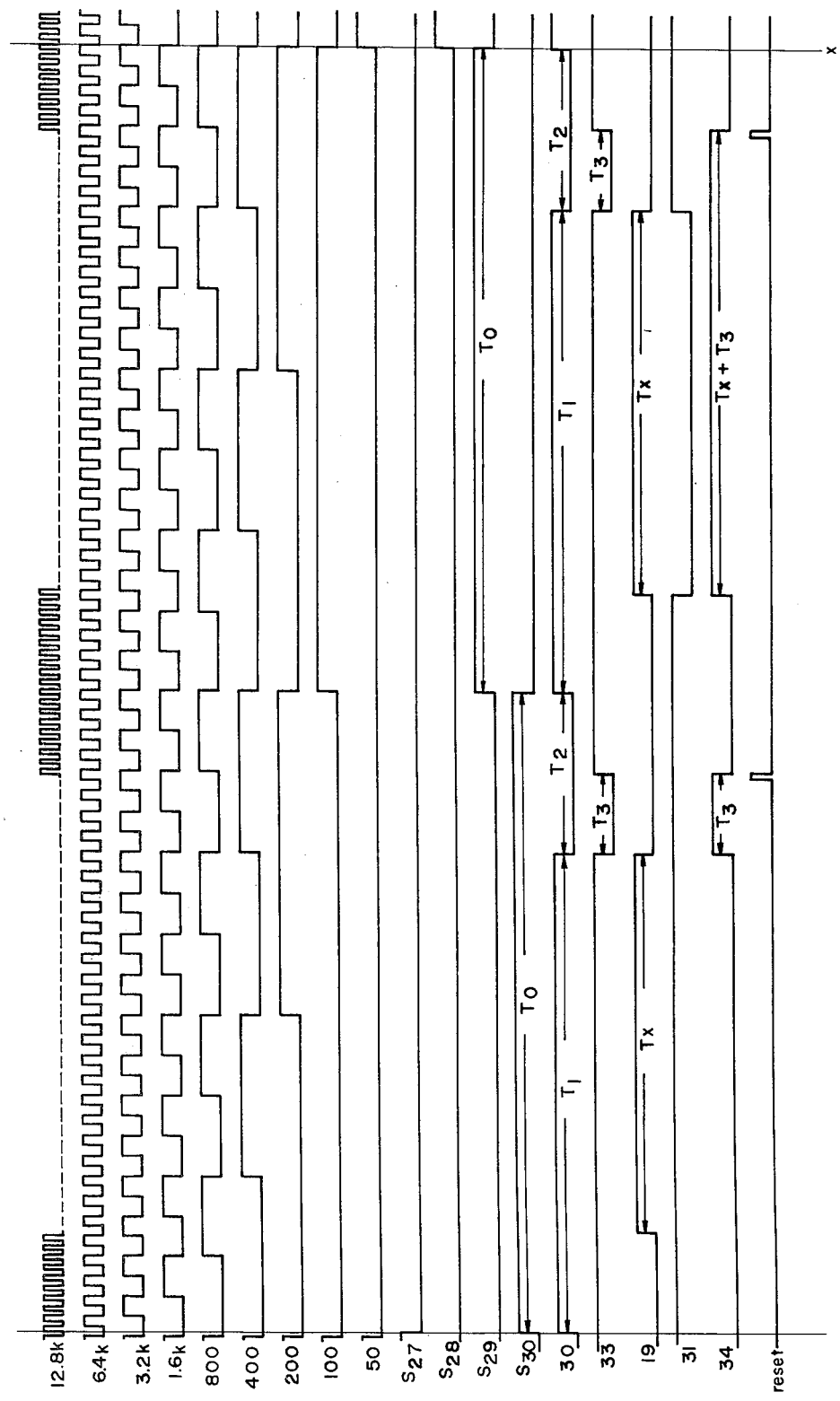
FIGS. 5a and 5b show a time chart of the indicator of FIG. 3.
Figure 5:
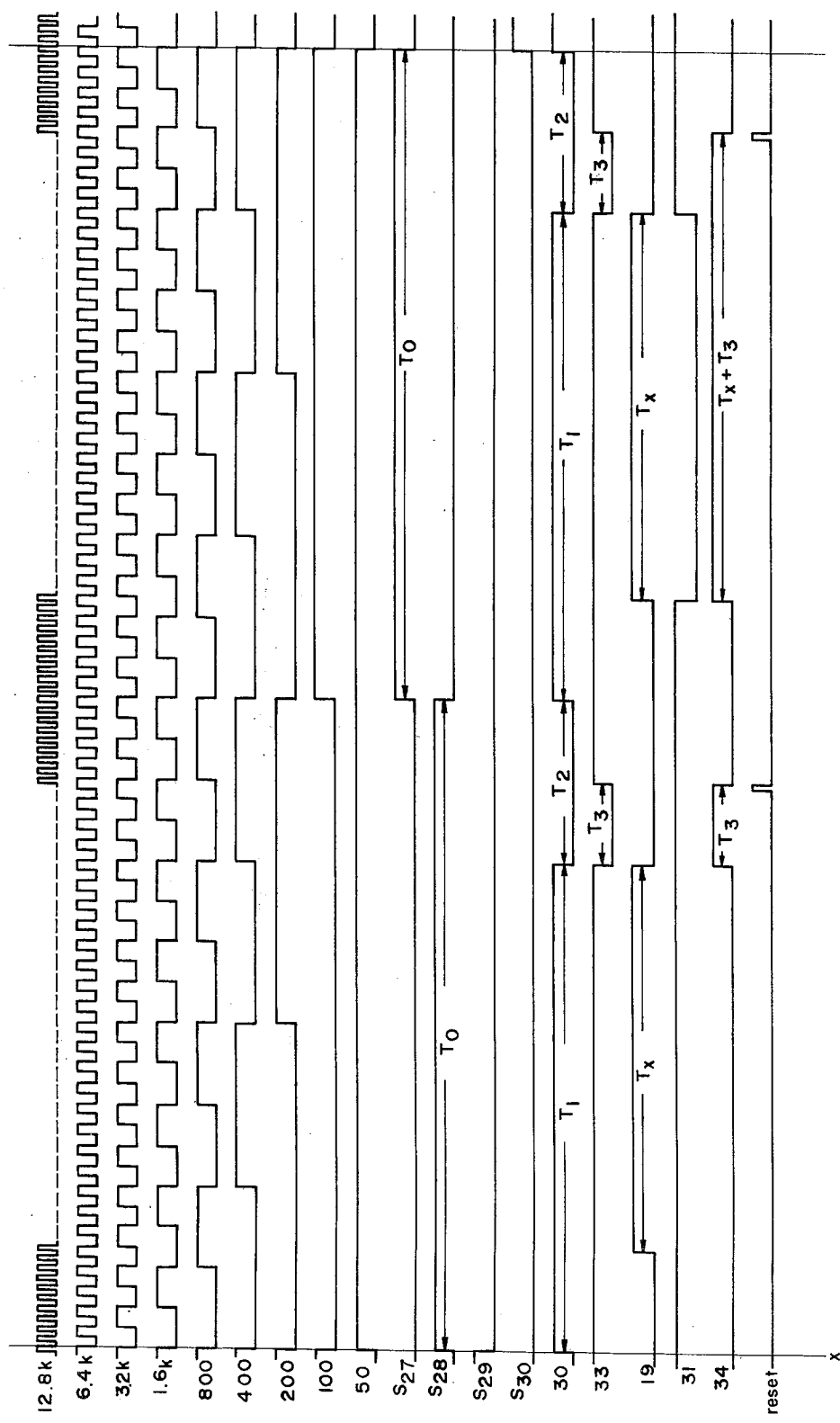

The function generator 18 is controlled by a NAND gate 30 which receives pulse signals of 200 Hz and 400 Hz from the frequency divider 17 and generates a pulse signal of "Hi" during the period of $T_1$ (=3.75 msec.) and of "Lo" during the period of $T_2$ (=1.25 msec.) with the phase relation as shown in FIG. 5 relative to the timing of opening and closing of the switches $S_{27}$ to $S_{30}$. FIG. 6a shows an embodiment of the function generator 18. A transistor $Tr_4$ has a base connected to the output of the NAND gate 30, an emitter connected to a junction point of a resistor $R_{10}$ and a Zener diode $Z_D$ which are connected in series between a DC voltage source +E and the ground G to provide a constant voltage source $V_{cc}$, and a collector grounded through resistors $R_{11}$ and $R_{12}$ to the earth. A capacitor $C_2$ is connected between the emitter and the collector of the transistor $Tr_4$ and the collector of the transistor $Tr_4$ is connected through a buffer amplifier 61 having gain 1 to the other input terminal of the comparator 19 and also to one of input terminals of a comparator 62, to the other input terminal of which is applied a reference voltage $V_s$ from the junction point of resistors $B_{13}$ and $R_{14}$ connected in series between the constant voltage source $V_{cc}$ and the ground. The comparator 62 compares the potential at the junction point of 60 with the reference voltage $V_s$ to apply an output of "Hi" to a base of a transistor $Tr_5$ when the potential at the junction point 60 becomes lower than the reference voltage $V_s$ to turn on the transistor $Tr_5$. A collector and an emitter of the transistor $Tr_5$ are connected to the junction point of the resistors $R_{11}$ and $R_{12}$ and to the ground, respectively.

With the function generator 18 constructed in FIG. 6a, when the output of the NAND gate 30 is "Lo", the transistor $Tr_4$ is turned on so that the junction point 60 has a voltage equal to the voltage of the constant voltage source $V_{cc}$, and when the output of the NAND gate 30 becomes "Hi", the transistor $Tr_4$ is turned off. As a result, the capacitor $C_2$ is charged through the resistors $R_{11}$ and $R_{12}$ so that the level of the junction point 60 becomes lower as indicated at a curve $A_1$ of FIG. 6b. When the potential at the junction point 60 becomes lower than the reference voltage $V_s$, the transistor $Tr_5$ is turned on so that the capacitor $C_2$ is charged only through the resistor $R_{11}$. Thus, the level of the junction point 60 becomes quickly lower as indicated at a curve $A_2$ of FIG. 6b. In this manner, it will be noted that the function generator 18 has the signal having the waveform varying from the level $V_{cc}$ as indicated at the curve A of FIG. 6b during the period $T_1$ at which the output of the NAND gate 30 is "Hi" and during the period $T_2$ at which it is "Lo". An emitter and a collector of a transistor $Tr_6$ and a capacitor $C_3$ are connected in series between the junction point 60 and the constant voltage source $V_{cc}$. The transistor $Tr_6$ is normally turned off, but turned on when a signal of "Lo" is applied to a control terminal 63 so that the capacitor $C_3$ is connected in parallel to the capacitor $C_2$ to be charged more slowly. Thus, the function generator 18 has a signal of waveform varying so as to decrease in its level from the level $V_{cc}$ to $V_y$ as indicated at a curve B of FIG. 6b.

The output of the comparator 19 which compares the detected output with the output of the function generator 18 is applied to one of input terminals of a NAND gate 31, the other input terminal of which has a pulse signal of 100 Hz applied from the freqency divider 17. The NAND gate 31 has the output applied to one of input terminals of a NAND gate 34, the other input terminal of which is connected to an output of a NAND gate 33 which in turn has a pulse signal of 200 Hz, a pulse signal of 400 Hz directly from the frequency divider 17 and a pulse signal of 800 Hz from the frequency divider 17 reversed by an inverter 32. The NAND gate 34 serves to control the switches $S_9$ to $S_{14}$ and $S_{21}$ to $S_{26}$ so that the grid terminals 12L and 12R of the fluorescent indicating tubes 11L and 11R for the L and R channels are connected to the L/R change-over switches $S_{15}$ to $S_{20}$ when the output of the NAND gate 34 is "Hi", and so that the former is disconnected from the latter when the output of the NAND gate 34 is "Lo".

Supposing that the detected output of level $V_x$ lower than the level of the constant voltage $V_{cc}$ is sampled by the comparator 19 while the output of waveform as indicated at the curve A of FIG. 6b is generated by the function generator 18 and while the switches $S_{27}$ to $S_{30}$ are sequentially closed, the comparator 17 generates the output of "Hi" during the period $T_x$ at the phase relative to the output waveform of the NAND gate 30 as shown in FIG. 5 while the NAND gates 31 and 34 have the output as shown in FIG. 5. More particularly, the NAND gate 34 has the output of "Hi" during the period $T_3$ (=0.625 msec.) corresponding to the pulse width of the pulse signal of 800 Hz when the output of the comparator 19 changes from "Hi" to "Lo" while the switch $S_{30}$ or $S_{28}$ is closed, and also during the period ($T_x + T_3$) when the output of the comparator 19 changes from "Lo" to "Hi" while the switch $S_{29}$ or $S_{27}$ is closed. Thus, since the driving voltage is applied to the grid terminals 12L and 12R of the fluorescent indicating tubes 11L and 11R during the period $T_3$ after the output of "Hi" disappears from the comparator 19 while the switch $S_{30}$ and $S_{28}$ is closed, the fluorescent indicating panels 9L and 9R ignite one of the segment anodes corresponding to the output condition of the output terminals $Q_1$ to $Q_{14}$ of the first and second counters 13 and 14 on the last count of the clock pulses applied to the clock terminal $C_L$ of the first counter while the comparator 19 has the output of "Hi". In this manner, the peak level of the detected output is indicated on the panels 11L and 11R. On the other hand, since the driving voltage is applied to the grid terminals 12L and 12R during the period $(T_x+T_3)$ when the comparator 19 has the output of "Hi" while the switch $S_{29}$ or $S_{27}$ is closed, the fluorescent indicating panels 9L and 9R sequentially ignite the segment anodes from the low level side in response to the output condition of the output terminals $Q_1$ to $Q_{14}$ of the counters 13 and 14 in the course of counting the clock pulses applied to the clock terminal $C_L$ of the counter 13 while the comparator 19 has the output of "Hi". The reset pulse applied to the reset terminals $C_R$ of the first and second counters 13 and 14 is supplied by counter reset means which generates an AND output by receiving the pulse signals of 200 Hz, 400 Hz, 1.6 kHz, 3.2 kHz, 6.4 kHz, 12.8 kHz and 800 Hz, the pulse signal of 800 Hz being reversed by the inverter 32, through diodes $D_3$ to $D_9$. This reset pulse is obtained when the switches $S_{27}$ to $S_{30}$ are closed and has the same pulse width as that of the pulse signal of 12.8 kHz with the raising down of the reset pulse corresponding to that of the output of the NAND gate 34. This reset pulse causes the counter means to be reset prior to initiation of sampling the detected outputs.

The radiance of the segment anodes of the fluorescent indicating tubes may be adjusted on the igniting time of the segment anodes. In the illustrated embodiment, since the raising up of the reset pulse approaches the raising up of the "Hi" output of the NAND gate 34 by removing the pulse signals of 12.8 kHz or 6.4 kHz from the pulse signals which are received by the counter reset means to obtain the reset pulse, the reset time of the first and second counters 13 and 14 can be controlled so that the radiance of the segment anodes is adjusted in the indication of the peak hold output.

With the fluorescent indicator constructed as aforementioned, if the manually operated switch $S_{31}$ is in the condition as shown in FIG. 3, the peak detected output for the L (or R) channel is applied to the indicator when the switch $S_{27}$ (or $S_{29}$) is closed, and therefore, the segment anodes are sequentially ignited from the lowest level side to the segment anode corresponding to the level of the peak detected output on initiation of counting the pulses so that the peak level is indicated on the fluorescent indicating panels. Also, the peak hold detected output for the L (or R) channel is applied to the indicator when the switch $S_{28}$ (or $S_{30}$) is closed, and therefore, one of the segment anodes corresponding to the highest peak level during counting the pulses while the output is held, so that the peak hold level is indicated on the fluorescent indicating panels.

If the manually operated switch $S_{31}$ is in the condition reverse to that of FIG. 3, the VU detected output for the L (or R) channel is applied to the indicator when the switch $S_{27}$ (or $S_{29}$) is closed, and therefore, the lowest level segment anode to the segment anode corresponding to the level of the VU detected output are sequentially ignited on initiation of counting the pulses so that the VU level is indicated on the fluorescent indicating panels. Also, the peak detected output for the L (or R) channel is applied to the indicator when the switch $S_{28}$ (or $S_{30}$) is closed, and therefore, one of the segment anodes corresponding to the peak detected output on initiation of counting the pulses is indicated on the fluorescent indicating panels. As noted from FIG. 6b, the forty-eight segment anodes indicate a wide range of detected output level of 0 to $V_{cc}$ in the output of the function generator 18 of a large variation ratio as indicated at a curve A while the forty-eight segment anodes indicate a narrow range of detected output level of $V_y$ to $V_{cc}$ in the output of the function generator of a small variation ratio as indicated at a curve B. Thus, it will be noted that a level scale of narrow range from $V_y$ to $V_{cc}$ may be preferably provided together with a level scale of wide range from 0 to $V_{cc}$ and that a "Lo" signal may be adapted to be applied to the control terminal 63 of the function generator. This permits the high level of the signal to be read out with more precision.

Since the L/R change-over switches $S_1$ to $S_8$ and $S_{15}$ to $S_{20}$ are quickly changed every 10 msec., the switches $S_{27}$ to $S_{30}$ are quickly changed every 5 msec. during 20 msec. for which the level is indicated at each of the channels, and the segment anodes are quickly ignited in a scanned manner, the fluorescent indicating panels 9L and 9R for the L and R channels seem to be simultaneously operated because of their afterimage. Also, it will be understood that the peak level (VU level) and the peak hold level (or peak level) can be simultaneously observed on the fluorescent indicating panels 9L and 9R, and that the segment anodes which are successively ignited at their peak level (or VU level) indication can be so observed as to be ignited simultaneously to form a successive line.

In the fluorescent indicator, the input terminals 20 to 23 of FIG. 3 are connected to the output terminals 5 to 8 of the phase difference detector of FIG. 1, so that the DC voltages $V_O$ are applied from the output terminals 5 and 7 to the input terminals 20 and 22 while the phase difference voltages in stead of the detected outputs are applied from the output terminals 6 and 8 to the input terminals 21 and 23.

Figure 7:
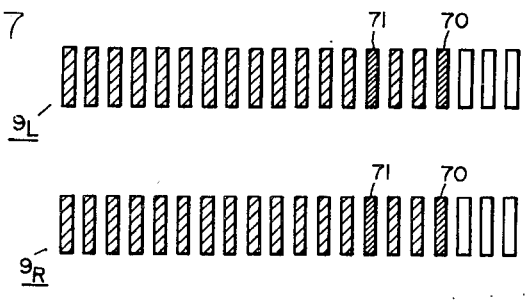
FIG. 7 illustrates the segment anodes of the fluorescent indicator being operated.

Thus, when the switch $S_{27}$ (or $S_{29}$) is closed, the DC voltage $V_O$ is sampled so that the lowest level indicating segment anode to the segment anodes for the level corresponding to the DC voltages $V_O$ are sequentially ignited. Also, when the switch $S_{28}$ (or $S_{30}$) is closed, the phase difference voltages are sampled so that one of the segment anodes corresponding to the level less than that of the DC voltage $V_O$ is ignited. These ignitions of the segment anodes are alternately and periodically made. If the recording head is vertically displaced relative to the reproducing head, the phase difference voltages are smaller than the voltage $V_O$, and as a result, the segment anodes can be observed to be ignited on the L and R fluorescent indicating panels as shown in FIG. 7, in which the segment anodes having the hatches are shown to be ignited. The segment anodes to be ignited corresponding to the DC voltage $V_O$ and the segment anodes to be ignited corresponding to the phase difference voltages are ignited on the outputs of the last count of the counter means. Since the ignition time of these segment anodes is longer than that of the other segment anodes, the radiance of these segment anodes is easily distinguished as shown in high density hatches from that of the other segment anodes. In this manner, it will be noted that the segment anodes 70 serve to be a reference mark which indicates that there is no vertical displacement between the recording and the reproducing heads, while the segment anodes 71 serve to be a movable mark which moves in its ignition position on the degree of the vertical displacement between the recording and the reproducing heads. Thus, if there is no vertical displacement between the two heads, then the movable mark is laid upon the reference mark because the phase difference voltages are equal to the voltage $V_O$. If there is a vertical displacement between the two heads, then the movable mark is far away from the reference mark as the degree of the displacement increases. If the vertical displacement is observed, then the recording head can be adjusted in its vertical direction so that the movable mark is laid upon the reference mark while the operator is observing the fluorescent indicator. It will be understood that the DC voltage $V_O$ may be applied to the input terminals 21 and 23 while the phase difference voltages may be applied to the input terminals 20 and 22.

In the above embodiment, the value of the DC voltage $V_O$ is less than, but preferably near that of the level $V_{cc}$ of the function generator 18 which varies as indicated at the curve B of small variation in the output of the function generator 18. This enables the fine adjustment of vertical position to be made under more precise indication. It should be noted that even if the reference mark is moved by variation in the DC voltage $V_O$ due to variation in the power source, the vertical displacement can be observed with precision because the movable mark is moved by variation in the phase difference voltages at the same ratio as that at which the DC voltage varies.

Although, in the illustrated embodiment, the signal level is indicated on the L and R fluorescent indicating panels, it may be indicated only on one fluorescent indicating panel.

While one preferred embodiment has been illustrated and described with reference to the accompanying drawings, it will be understood that it is by way of example, and that various changes and modifications may be made without departing from the spirit and scope of the invention, which is intended to be defined only by the appended claims.

What is claimed is:

1. A fluorescent indicator comprising:
   at least one fluorescent indicating tube having a plurality of segment anodes arranged in a row from a lowest level side to a highest level side;
   pulse generator means to generate clock pulses having the number of pulses corresponding to the signal levels to be measured;
   counter means including a plurality of output terminals connected to said segment anodes, respectively, to have output signals sequentially generated on the count of said clock pulses to operate said segment anodes of said fluorescent indicating tube;
   said fluorescent indicating tube starting to be operated on initiation of counting the clock pulses;
   and said segment anodes of said fluorescent indicating tube being sequentially operated from the lowest level side toward the highest level side as the signal level becomes higher.

2. A fluorescent indicator as set forth in claim 1, the fluorescent indicating tubes of the number n each having the segment anodes of the number m being arranged in series to each other in a row from a lowest level side to a highest level side, said counter means including a first counter having the output terminals of the number m at which the output signals are sequentially generated in a repeated manner and a second counter having the output terminals of the number n at which the output signals are sequentially generated each after termination of and during one cycle of repeated output signals of said first counter, the output terminals of said first counter being connected to said segment anodes of each of said fluorescent indicating tubes, respectively, and the output terminals of said second counter being connected to a grid of each of said fluorescent indicating tubes.

3. A fluorescent indicator as set forth in claim 1, and further comprising grid control means to apply a first drive voltage to a grid of said fluorescent indicating tube after said counter means starts to count the pulse signals at least until said counter means terminates to count them and to apply a second drive voltage to said grid of said fluorescent indicating tube during a given time after termination of counting the pulse signals, said fluorescent indicating tube having the lowest level segment anode to the segment anode corresponding to the maximum level of said signal sequentially ignited when said first drive voltage is applied to said grid of said fluorescent indicating tube and having one of said segment anodes ignited corresponding to the maximum level of said signal when said second drive voltage is applied.

4. A fluorescent indicator as set forth in claim 1, the first and second fluorescent indicating tubes being provided, said pulse generator means generating the clock pulses having the number of pulses corresponding to the levels of the first and second signals periodically and alternately sampled during a given time, and further comprising switch means to connect said segment anodes of said first fluorescent indicating tubes with the corresponding output terminals of said counter means when said first signal is sampled and to connect the segment anodes of said second fluorescent indicating tubes with the corresponding output terminals of said counter means, and counter reset means to reset said counter means prior to sampling said first and second signals.

5. A fluorescent indicator as set forth in claim 1, said pulse generator means generating the clock pulses having the number of pulses corresponding to the level of the first and second detected output signals periodically and alternately sampled during a given time, said second detected output signal having the level higher than that of said first detected output signal, and further comprising grid control means to apply a first drive voltage to a grid of said fluorescent indicating tube after said counter means starts to count the pulse signals at least until said counter means terminates to count them and to apply a second drive voltage to said grid of said fluorescent indicating tube during a given time after termination of counting the pulse signals on sampling said second detected output signal, and counter reset means to reset said counter means prior to sampling said first and second detected output signals, said fluorescent indicating tube having the lowest level segment anode to the segment anode corresponding to the maximum level of said first detected output signal sequentially ignited when said first drive voltage is applied to said grid of said fluorescent indicating tube and one of said segment anodes ignited corresponding to the maximum level of said second detected output signal when said second drive voltage is applied.

6. A fluorescent indicator as set forth in claim 5, and wherein said first detected output signal is a VU detected output signal while said second detected output signal is a peak level detected output signal of said first detected output signal.

7. A fluorescent indicator as set forth in claim 5, and wherein said first detected output signal is a peak level detected output signal while said second detected output signal is one which holds said first detected output signal during a given time.

8. A fluorescent indicator as set forth in claim 1, and further comprising a function generator to generate an output varying in its level from a given value and having a variation ratio different on selection, said pulse generator means comparing the level of said input signal with that of said output from said function generator to generate said pulse signals during a period of a given time at which the level of said output from said function generator is lower than said input signal, and said fluorescent indicating tube indicating said input signal at a different range of level on the selection of said variation ratio of said output from said function generator.

9. A fluorescent indicator used for a tape recorder having a magnetic head for a multi-channel comprising:

at least one fluorescent indicating tube having a plurality of segment anodes arranged in a row from a lowest level side to a highest level side;

pulse generator means to generate clock pulses having the number of pulses corresponding to signal levels to be measured;

counter means including a plurality of output terminals connected to said segment anodes of said fluorescent indicating tube, respectively, to have output signals sequentially generated corresponding to the count of said clock pulses to operate said segment anodes of said fluorescent indicating tube;

said fluorescent indicating tube starting to be operated on initiation of counting said clock pulses while said segment anodes of said fluorescent indicating tube are sequentially operated from the lowest level side toward the highest level side as the signal level increases;

and a phase difference detector to electrically detect a phase difference between reproducing output signals for the channels on a magnetic tape of said tape recorder, said phase difference detector being associated with said pulse generator means so that said segment anodes are alternately ignited at one period by a reference signal having the level equal to that of said phase difference signal which is detected when there is no phase difference between said reproducing output signals and at another period by said phase difference signal having the level lower than that of said reference signal in accordance with a phase difference between said reproducing output signals.

* * * * *